United States Patent [19]

Thomas

[11] Patent Number: 4,607,136

[45] Date of Patent: Aug. 19, 1986

[54] CHILDPROOF ELECTRICAL WALL OUTLET PROTECTIVE DEVICE

[75] Inventor: Richard D. Thomas, Chicago, Ill.

[73] Assignee: C.R.S. Products Co. Inc., Chicago, Ill.

[21] Appl. No.: 716,626

[22] Filed: Mar. 27, 1985

[51] Int. Cl.[4] .............................................. H05K 5/03

[52] U.S. Cl. ...................................... 174/67; 220/242; 339/36

[58] Field of Search ...................... 174/66, 67; 339/36, 339/37, 39, 41, 42, 44 M; 220/241, 242

[56] References Cited

U.S. PATENT DOCUMENTS 4,070,078 1/1978 Chrones ................................ 174/67

*Primary Examiner*—Arthur T. Grimley
*Assistant Examiner*—Jane K. Lau
*Attorney, Agent, or Firm*—Wallenstein, Wagner, Hattis, Strampel & Aubel, Ltd.

[57] ABSTRACT

A childproof protective device adapted to be secured on an electrical wall outlet. The device includes a plate having openings therethrough which are in register with the plug receptacles of the outlet when the device is mounted thereon. The plates carries a pair of slidable doors or panels which can be releasably locked in position to prevent a child from gaining access to the plug receptacles.

18 Claims, 8 Drawing Figures

FIG. 1
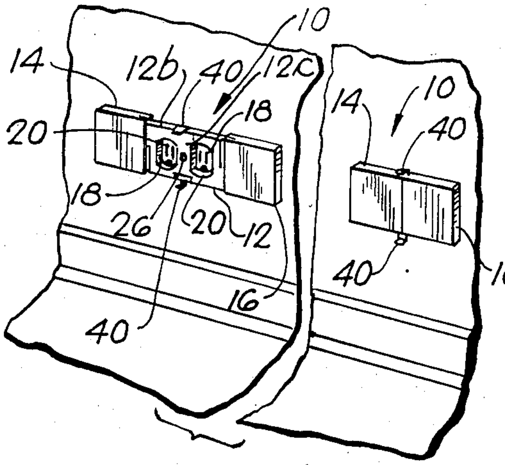
FIG. 2
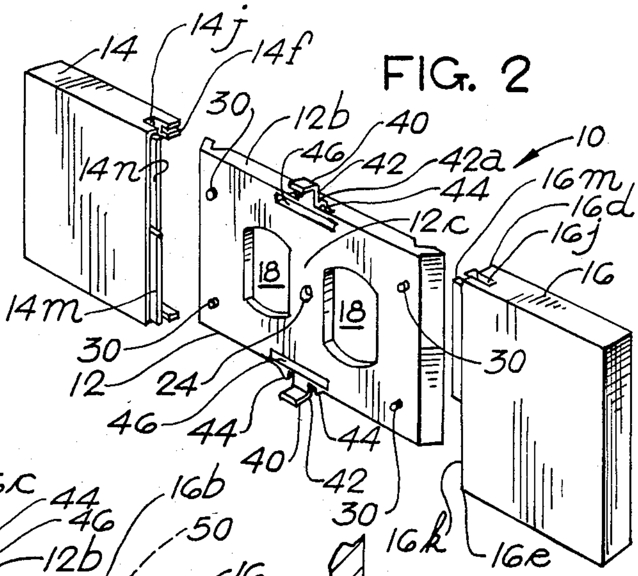
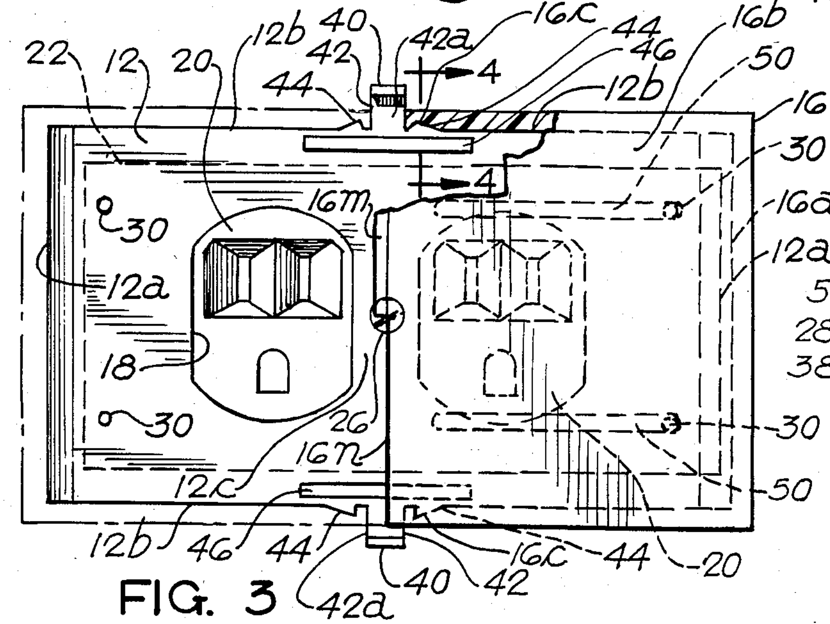
FIG. 3
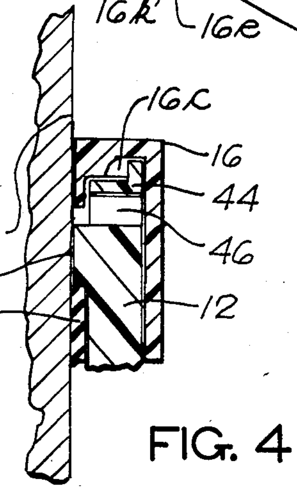
FIG. 4
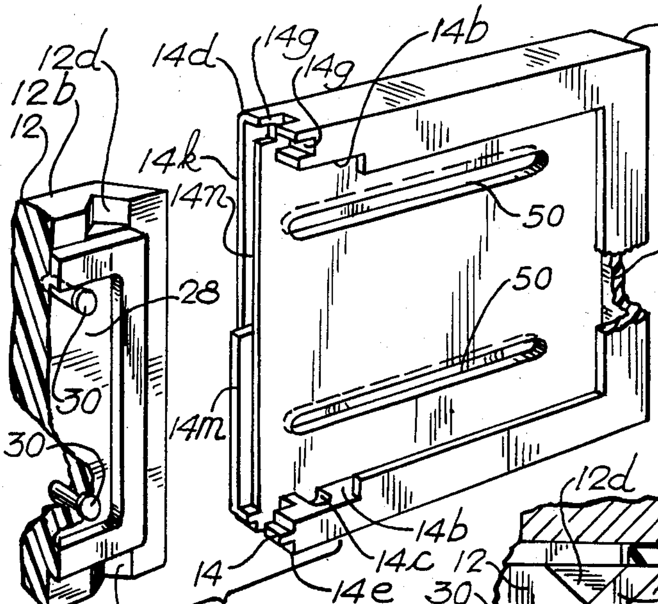
FIG. 5
FIG. 6A
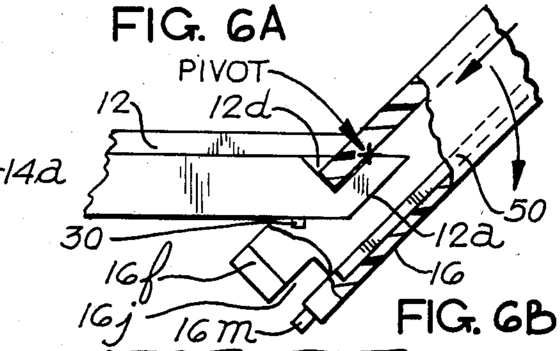
FIG. 6B
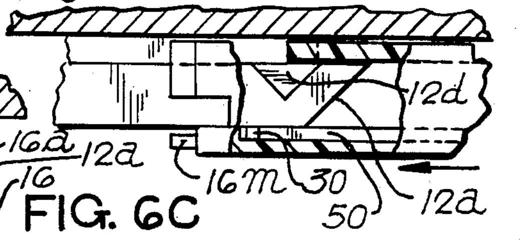
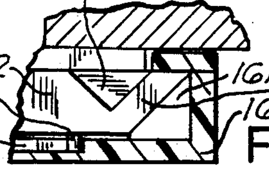
FIG. 6C

CHILDPROOF ELECTRICAL WALL OUTLET PROTECTIVE DEVICE

FIELD OF THE INVENTION

This invention relates to a protective device for an electrical wall outlet, and, in particular, to a childproof protective device for an electrical wall outlet.

BACKGROUND OF THE INVENTION

Wall outlet covers intended to prevent a small child from gaining access to the electrical plug receiving receptacles of the outlet, and inserting an electrical shock producing conductor therein, have heretofore been proposed. Exemplary of one such cover is the device disclosed in U.S. Pat. No. 4,302,624. The device shown in that patent comprises a housing for carrying a pair of pivotally mounted, spring biased cover plates which, when closed, overlie the plug receptacles of an electrical wall outlet. The plug receptacles can be exposed to view by simply pivoting the cover plates to their open position, a maneuver which even a child of two or three years of age can readily perform, especially when he or she has observed an adult swing the plates to an open position. A device of the type shown in the aforementioned patent also falls short of being childproof in that the cover plates, in their open position, can be easily grasped by a small child and broken off the housing thereby destroying any protective function the device may have.

SUMMARY OF THE INVENTION

In accordance with the present invention, a protective device for an electrical wall outlet has been evolved which, while easily operable by an adult, requires a coordination of finger and hand movements too difficult for a small child to carry out thereby rendering the device childproof. The device, in addition, can be provided with insulation means for preventing cold air and moisture from passing into a living area from spaces behind an electrical wall outlet on which the device is mounted. The device, in brief, comprises a body portion adapted to be secured directly to an electrical wall outlet. The body portion has openings provided therethrough which are in register with the plug receptacles of the wall outlet when the body portion is in position thereon. The body portion further is provided with opposed, releasable locking means which can be moved to a release position by a user by spanning the fingers of one hand. A pair of movable panels are slidably carried on the body portion for preventing access to the plug receptacles of the wall outlet during periods of non-use. Each of the panels is provided with locking means releasably interengageable with the locking means on the body portion. The interengageable relationship of the opposed locking means on the body portion and the locking means on the panels is such that the opposed locking means must be disengaged simultaneously from the cooperating locking means on the panels before either one, or both, of the panels can be moved to a position which will enable a plug connected to a lamp, appliance, or the like, to be inserted into the plug receptacles of the electrical wall outlet. The panels in their open position, lie in close, or abutting, substantially parallel relation to the wall in which the electrical wall outlet is mounted. This arrangement, coupled with the fact that the panels are securely attached to the body portion in their open, as well as their closed position, provides no ready means for the small, prying hands of a young child to grasp the panels and separate them from the body portion. The body portion advantageously is lined with an insulative material to cut off drafts, and to intercept any moisture which may exit into a living area from spaces behind the electrical wall outlet. The protective device desirably is fabricated of a non-conductive plastic material, and can be colored to coordinate it with the decor of a room in which it is used.

BRIEF DESCRIPTION OF THE DRAWINGS

FIG. 1 comprises views in perspective showing an embodiment of the protective device of the present invention mounted on an electrical wall outlet, and illustrating the device in an open and a closed condition;

FIG. 2 is an exploded view of said embodiment of the protective device;

FIG. 3 is a front view in elevation, partly in section, showing the cooperating locking means on one panel or door, and the body portion, interengaged;

FIG. 4 is a sectional view taken substantially along line 4—4 of FIG. 3;

FIG. 5 is a perspective view, partly in section, of the rear of one of the panels or doors of said embodiment of the device, and a rear view of a segment of the body portion of the device; and FIGS. 6A, 6B and 6C are enlarged assembly views, partly in section, showing the manner in which the panels or doors are engaged on the body portion of said embodiment of the device.

DETAILED DESCRIPTION OF THE INVENTION

Referring, now, in particular, to FIGS. 1 and 2 of the drawings, the embodiment of the childproof protective device illustrated, and designated generally by reference numeral 10, comprises an electrical wall outlet engaging plate or body portion 12, and a pair of slidable doors or panels 14 and 16 adapted to be carried on the plate or body portion 12. The body portion and the panels 14 and 16 advantageously are formed of a non-conductive plastic material such as polyethylene, polypropylene, a polyacrylate, a polyester, or the like.

The plate or body portion 12 of the device 10, as illustrated, is generally rectangular in shape, and, in this respect, resembles a conventional cover plate for an electrical wall outlet. The body portion 12 desirably has beveled end edges **12*a*—12*a*, and flattened, smooth side edges 12*b*—12*b*. A pair of holes or openings 18—18 are provided in the body portion 12 which are adapted to be positioned in register with the plug receptacles 20—20 (see FIGS. 1 and 3) of a standard electrical wall outlet 22 when the device 10 is mounted thereon A center or web portion 12*c*, having a bore 24 therethrough, separates the openings 18—18. The bore 24 is adapted to receive a screw 26 for securing the body portion 12 on the wall outlet 22**.

As best illustrated in FIGS. 4 and 5 of the drawings, the rear wall 28 of the body portion advantageously is recessed to accommodate the wall outlet 22. As shown in FIG. 5, a gasket 38, desirably formed of a moisture-proof and heat insulating material, can be secured to the rear wall 28 of the body portion 12 to prevent any moisture or unheated air behind the outlet 22 from entering the interior of a house, for example. The rear wall 28 of the body portion 12 also advantageously is provided with two spaced pairs of integrally formed guide pins 30—30, the function of which will become clear as the description proceeds.

The flattened, smooth side edges 12b—12b of the body portion 12, at a point approximately intermediate the ends 12a—12a thereof, are provided with opposed, releasable locking members 40—40 which advantageously are formed integral with the body portion 12. Each of the locking members 40—40 includes an outwardly extending, finger engaging actuating arm 42, and a pair of angled or tapered extensions or teeth 44—44 positioned in spaced relation on each side of the actuating arms 42. While the extensions or teeth 44—44 are shown as being cusped or peaked, they can be formed with a rounded or arched configuration for reasons that will be pointed out hereinafter. As shown, the locking members 40—40 are relatively thin in cross-section and bridge elongated recesses 46—46 formed in the side edges 12b—12b of the body portion 12. This arrangement enables the locking members 40—40 to be flexed or bent slightly inwardly for reasons that will become clear as the description proceeds.

The doors or panels 14 and 16, as shown, are each formed with an end channel 14a and 16a, respectively, for receiving the beveled end edges 12a—12a of the body portion 12 when the panels 14 and 16 are in a closed or locked position as illustrated in FIGS. 1 and 6C. In addition, the panels 14 and 16 are each provided with side channels 14b—14b and 16b—16b, respectively, for receiving the side edges 12b—12b of the body portion 12, and along which the panels 14 and 16 slide to their open and closed positions, again, as shown in FIG. 1.

The side channels 14b—14b and 16b—16b of the panels 14 and 16 are each provided with a depression or recess 14c and 16c, respectively, inwardly of the free ends 14d and 14e, and 16d and 16e, thereof, for receiving the tapered teeth 44—44 located on the opposed locking members 40—40 carried on the body portion 12 (see FIG. 3). In those instances where the teeth 44—44 have a rounded or arched configuration, the recesses 14c and 16c desirably are beveled along their leading edge to facilitate disengagement of the teeth 44—44 from the recesses 14c and 16c. The free ends 14d and 14e of the panel 14 desirably are provided with a tongue 14f and a slot or groove 14g adapted to interengage with a slot or groove 16g and a tongue 16f, respectively, provided on the free ends 16d and 16e of the panel 16 when the panels are in a closed or locked position. The free ends 14d and 14e, and 16d and 16e, advantageously also are provided with slots 14j and 16j, respectively, adjacent to, and inwardly of the leading or free edge 14k and 16k of each of the panels 14 and 16. The slots 14j and 16j are adapted to receive the base 42a of the actuating arm 42 of the locking members 40—40 when the panels 14 and 16 are in their closed or locked position.

The leading or free edges 14k and 16k of the panels 14 and 16 desirably are formed with an elongated tongue 14m and 16m, respectively, and a correspondingly elongated slot or groove 14n and 16n, respectively, which interengage with one another when the panels 14 and 16 are closed or locked. The panels 14 an 16 also are provided with a pair of spaced, elongated, close-ended guide pin retaining grooves or recesses 50—50 for limiting the extent to which the panels 14 and 16 can be moved in relation to the body portion 12.

As best illustrated in FIGS. 6A, 6B and 6C of the drawings, the panels 14 and 16 are positioned on the body portion 12 by tilting the beveled end edges 12a—12a of the body portion 12 at an angle with relation to the leading or free edge 14k and 16k of the panels 14 and 16, and then sliding the panels 14 and 16 onto the flattened, smooth side edges 12b—12b of the body portion 12. To provide clearance for this operation, generally V-shaped recesses 12d—12d are formed in the body portion 12 in the edges 12b—12b thereof, inwardly of the beveled end edges 12a—12a. The recesses 12d—12d, as shown in FIG. 6A, serve to enable a section of the inner wall of each of the side channels 14b—14b and 16b—16b of the panels 14 and 16 to be received therein, thereby permitting the guide pins 30—30 on the body portion 12 to be positioned in the pin retaining grooves 50—50 of the panels 14 and 16.

In operation, the panels 14 and 16 are moved to a closed or locked position by merely sliding them singly, or together, along the flattened, smooth side edges 12b—12b of the body portion 12 in the direction of the locking members 40—40 until the teeth 44—44 snap into engagement with the recesses 14c and 16c formed in the panels 14 and 16. When thusly locked in position, the base 42a of each of the arms 42 is engaged in the slots 14j and 16j, and the tongues 14f and 16f are engaged in the grooves 16g and 14g, respectively. The tongues 14m and 16m, in addition, are in position in their respective grooves 16n and 14n. In their closed or locked position, as illustrated in the drawing on the right in FIG. 1, the panels 14 and 16 abut the wall 52 (see FIG. 4) in which the electrical outlet is mounted, and do not present any free margins, or areas, which can be gripped by the hands of a small child. When it is desired to slide either one, or both, of the panels 14 and 16 to an open position as illustrated in the drawing on the left in FIG. 1, the user places the index finger and the thumb of one hand on the arms 42 of the locking members 40—40, and exerts an inward pressure sufficient only to flex the locking members 40—40 inwardly a distance to disengage the teeth 44—44 from the recesses 14c and 16c of the panels 14 and 16. The elongated recesses 46—46 in the body portion 12 accommodate this flexing action of the members 40—40. With the locking members 40—40 in this flexed condition, the user, by means of his other hand, can slide the panels 14 and 16 to an open position thereby exposing the plug receptacles 20—20 for use. The extent to which the panels 14 and 16 can slide in either direction along the body portion 12 is delimited by the length of the grooves 50—50 in panels 14 and 16 in which the guide pins 30—30 ride. The distance between the arms 42, coupled with the coordination required in finger and hand movement in sliding the panels 14 and 16 to an open position is such that a small child will be completely frustrated in his or her attempts to move the panels even though the child may have observed an adult performing the operation.

While for purposes of illustration a specific embodiment of the invention has been shown and described, modifications and variations of the invention may become apparent to those skilled in the art upon reference to this disclosure, and, accordingly, the scope of the invention is to be determined by the appended claims.

What is claimed is:

1. A childproof protective device for electrical wall outlets, comprising: a body portion adapted to be secured on an electrical wall outlet, said body portion having openings therethrough which are in register with the plug receptacles of the outlet when the body portion is in position on the outlet; flexibly releasable locking means positioned in opposed relation on the body portion; panel means carried on the body portion and laterally movable with relation thereto for preventing access to the plug receptacles of the outlet when the receptacles are not in use; and opposed, non-flexible locking means on said panel means releasably interengageable with the opposed locking means on the body portion whereby the panel means can be moved to a position on the body portion to expose one or both of the plug receptacles when the opposed locking means on the body portion are flexed to simultaneously disengage the non-flexible locking means on the panel means.

2. A protective device according to claim 1 wherein the body portion has flattened, smooth side edges along which the movable panel means can be moved to a closed or an open position, and the opposed locking means on the body portion is positioned at a substantially intermediate point along said side edges.

3. A protective device according to claim 2 wherein the movable panel means are provided with channel means for receiving the flattened, smooth side edges of the body portion, said channel means acting to guide the movement of the panel means along the body portion.

4. A protective device according to claim 1 wherein the opposed locking means on the body portion are flexible under finger applied pressure, and recesses are provided in the body portion to accommodate the flexing action of the locking means under such pressure.

5. A protective device according to claim 1 wherein an outwardly extending actuating arm is associated with the locking means on the body portion, said arm being adapted to be engaged by the fingers of a user in effecting simultaneous disengagement of the locking means on the body portion and the locking means on the panel means.

6. A protective device according to claim 5 wherein the opposed locking means on the body portion includes a pair of teeth positioned in spaced relation on opposite sides of the actuating arm.

7. A protective device according to claim 6 wherein the opposed locking means on the panel means includes recesses for receiving the teeth of the locking means on the body portion.

8. A protective device according to claim 5 wherein the panel means are provided with slots for receiving a portion of the actuating arm when the panel means are in a closed position on the body portion.

9. A protective device according to claim 1 wherein each of the panel means is provided with cooperating interengaging means which aid in resisting any forces tending to disengage the panel means from the body portion.

10. A protective device according to claim 9 wherein the cooperating interengaging means comprises opposed tongue and groove means provided along the inner free edges of the panel means.

11. A protective device according to claim 1 wherein cooperating guide means is provided on the body portion and the panel means for limiting lateral movement of the panel means in relation to the body portion.

12. A protective device according to claim 11 wherein the cooperating guide means on the body portion comprises a plurality of guide pins, and the cooperating guide means on the panel means comprises elongated grooves for receiving the guide pins on the body portion.

13. A protective device according to claim 1 wherein a layer of an insulating material is carried on the back of the body portion for preventing drafts, or the like, from passing from unheated areas behind the electrical wall outlet on which the device is mounted into heated areas on the other side of the outlet.

14. A protective device according to claim 1 wherein the body portion is provided with beveled end edges for facilitating the assembly of the panel means on the body portion.

15. A protective device according to claim 14 wherein the body portion is provided with recesses inwardly of the beveled end edges thereof, said recesses providing sufficient clearance to enable the beveled end edges to be received by the panel means and the panel means to be mounted on the body portion.

16. A childproof protective device for electrical wall outlets, comprising a body portion adapted to be secured on an electrical wall outlet, said body portion having openings therethrough which are in register with the plug receptacles of the outlet when the body portion is in position on the outlet; a pair of panels slidably engaged on the body portion for preventing access to the plug receptacles of the outlet when the panels are in a closed position; releasable locking means positioned in opposed relation on the body portion between said panels; opposed locking means provided on the panels adapted to be releasably interengaged with the locking means on the body portion when the panels are in a closed position; and actuating means for the opposed locking means on the body portion, said actuating means serving to enable a user of the protective device, by means of finger pressure, to simultangeously disengage the opposed locking means on the body portion from the opposed locking means on the panels thereby permitting either one or both of the panels to be moved to a position on the body portion which will render the plug receptacles of the electrical wall outlet accessible.

17. A protective device according to claim 16 wherein the releasable locking means on the body portion has a cross-sectional area such that it can be flexed inwardly under finger pressure applied to the actuating means by a user.

18. A protective device according to claim 17 wherein the body portion is provided with means for accommodating a portion at least of the locking means thereon when the locking means is flexed under finger pressure applied by a user.

* * * * *